(12) United States Patent
Komori et al.

(10) Patent No.: US 9,318,328 B2
(45) Date of Patent: Apr. 19, 2016

(54) METHOD AND APPARATUS FOR FORMING SILICON FILM

(71) Applicant: TOKYO ELECTRON LIMITED, Tokyo (JP)

(72) Inventors: Katsuhiko Komori, Nirasaki (JP); Akinobu Kakimoto, Nirasaki (JP); Mitsuhiro Okada, Nirasaki (JP); Nobuhiro Takahashi, Nirasaki (JP)

(73) Assignee: TOKYO ELECTRON LIMITED (JP)

( * ) Notice: Subject to any disclaimer, the term of this patent is extended or adjusted under 35 U.S.C. 154(b) by 0 days.

(21) Appl. No.: 13/901,712

(22) Filed: May 24, 2013

(65) Prior Publication Data

US 2013/0323915 A1 Dec. 5, 2013

(30) Foreign Application Priority Data

May 29, 2012 (JP) .................................. 2012-121940

(51) Int. Cl.
*H01L 21/3105* (2006.01)
*H01L 21/762* (2006.01)
*H01L 21/285* (2006.01)
*H01L 21/205* (2006.01)
*H01L 21/02* (2006.01)
*C23C 16/04* (2006.01)
*C23C 16/24* (2006.01)

(52) U.S. Cl.
CPC ........ *H01L 21/02658* (2013.01); *C23C 16/045* (2013.01); *C23C 16/24* (2013.01); *H01L 21/0243* (2013.01); *H01L 21/0245* (2013.01); *H01L 21/0262* (2013.01); *H01L 21/02532* (2013.01); *H01L 21/02579* (2013.01); *H01L 21/76224* (2013.01); *H01L 21/76232* (2013.01)

(58) Field of Classification Search
CPC .................... H01L 21/02164; H01L 21/0243; H01L 21/31053; H01L 21/76224; H01L 21/76229; H01L 21/76232; H01L 21/76262; H01L 21/76831; H01L 21/823878
USPC .......................................... 438/435, 700, 791
See application file for complete search history.

(56) References Cited

U.S. PATENT DOCUMENTS

2008/0090352 A1* 4/2008 Lee et al. ........................ 438/257
2008/0182382 A1* 7/2008 Ingle et al. ..................... 438/435

FOREIGN PATENT DOCUMENTS

| JP | 62098747 | 5/1987 | |
| JP | 04-010412 | * 1/1992 | ............. H01L 21/28 |
| JP | 04058525 | 2/1992 | |
| JP | 04118924 | 4/1992 | |
| JP | 10321556 | 12/1998 | |
| JP | 10321612 | 12/1998 | |
| JP | 2000232093 | 8/2000 | |

(Continued)

*Primary Examiner* — Pamela E Perkins
(74) *Attorney, Agent, or Firm* — Cantor Colburn LLP (57) ABSTRACT

A method of forming a silicon film includes a first film forming process, an etching process, a doping process, and a second film forming process. In the first film forming process, a silicon film doped with impurities containing boron is formed so as to embed a groove provided on an object to be processed. In the etching process, the silicon film formed in the first film forming process is etched. In the doping process, the silicon film etched in the etching process is doped with impurities containing boron. In the second film forming process, a silicon film doped with impurities containing boron is formed so as to embed the silicon film that is doped in the doping process.

6 Claims, 5 Drawing Sheets

(56) References Cited

FOREIGN PATENT DOCUMENTS

| JP | 2001196573 | 7/2001 |
| JP | 2003124141 | 4/2003 |
| JP | 2012004542 | 1/2012 |
| KR | 1020060045053 | 5/2006 |
| KR | 1020090037821 | 4/2009 |
| KR | 1020110128145 | 11/2011 |

* cited by examiner

METHOD AND APPARATUS FOR FORMING SILICON FILM

CROSS-REFERENCE TO RELATED PATENT APPLICATIONS

This application claims the benefit of Japanese Patent Application No. 2012-121940, filed on May 29, 2012 in the Japan Patent Office, the disclosure of which is incorporated herein in its entirety by reference.

BACKGROUND OF THE INVENTION

1. Field of the Invention

The present invention relates to a method and apparatus for forming a silicon film.

2. Description of the Related Art

Processes of manufacturing a semiconductor device, for example, a storage node contact of dynamic random access memory (DRAM) or a control gate of a flash memory, include a process of embedding a silicon (Si) film such as a polysilicon film doped with impurities such as boron (B) on a trench or a hole-shaped groove provided on an object to be processed, for example, a semiconductor wafer.

As such a process, for example, Patent Reference 1 discloses a film forming method of performing a surface treatment by supplying a hydrogen compound-based doping gas to reduce a surface of an object to be processed, and then supplying the doping gas and a film forming gas to form a film.

However, owing to the miniaturization of semiconductor devices, a width of the groove to be embedded tends to be reduced. Accordingly, it is likely that a void or a seam is generated in the groove when embedding a Si film, and the void or the seam becomes a resistive element.

PRIOR ART REFERENCE (Patent Reference 1) Japanese Laid-open Patent Publication No. hei 10-321612

SUMMARY OF THE INVENTION

The present invention provides a method and apparatus for forming a silicon film that may prevent a void or a seam from generating.

According to an aspect of the present invention, there is provided a method of forming a silicon film on a groove provided on a surface of an object to be processed, the method including: a first silicon film forming process of forming a first silicon film doped with impurities including boron so as to embed the groove; an etching process of etching the first silicon film formed in the first silicon film forming process; and a second silicon film forming process of forming a second silicon film doped with impurities including boron so as to embed the first silicon film that is etched in the etching process.

According to another aspect of the present invention, there is provided an apparatus for forming a silicon film on a groove provided on a surface of an object to be processed, the apparatus including: a first silicon film forming unit which forms a first silicon film doped with impurities including boron so as to embed the groove; an etching unit which etches the first silicon film formed by using the first silicon film forming unit; and a second silicon film forming unit which forms a second silicon film doped with impurities including boron so as to embed the first silicon film etched by the etching unit.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Hereinafter, a method and apparatus for forming a silicon film, according to embodiments of the present invention, will be described. In the embodiments of the present invention, a batch-type vertical thermal treatment apparatus shown in FIG. 1 is used as an apparatus for forming a silicon film, as an example.

Figure 1:
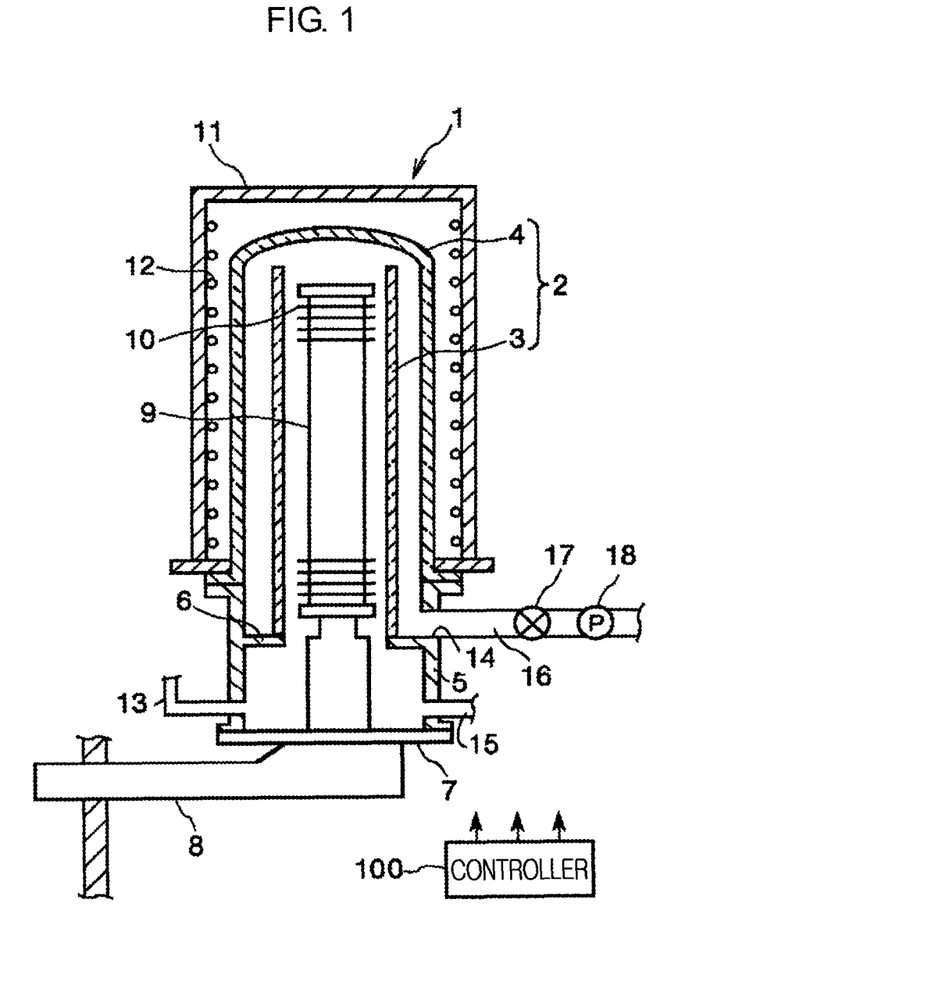
FIG. 1 is a view of a thermal treatment apparatus according to an embodiment of the present invention.

As shown in FIG. 1, a thermal treatment apparatus 1 includes a reaction chamber 2 having a cylindrical shape, a length direction of which is in a vertical direction. The reaction chamber 2 has a double chamber structure including an inner chamber 3 and an outer chamber 4 having a ceiling that surrounds the inner chamber 3 in a predetermined distance from the inner chamber 3. The inner chamber 3 and the outer chamber 4 are formed of a material having excellent heat resistance and corrosion resistance, for example, quartz.

A manifold 5, formed of a stainless steel (SUS) in a cylindrical shape, is disposed under the outer chamber 4. The manifold 5 is hermetically connected to a lower end of the outer chamber 4. Also, the inner chamber 3 is supported by a support ring 6 that is integrally provided with the manifold 5 while protruding from an inner wall of the manifold 5.

A lid 7 is disposed below the manifold 5, and the lid 7 is configured to elevate in up and down directions by a boat elevator 8. In addition, when the lid 7 is elevated by the boat elevator 8, a lower side of the manifold 5 (a furnace entry portion) is closed, and when the lid 7 is descended by the boat elevator 8, the lower side of the manifold 5 (the furnace entry portion) is opened.

A wafer boat 9 formed of, for example, quartz, is placed on the lid 7. The wafer boat 9 is configured so that a plurality of objects to be processed, for example, semiconductor wafers 10, can be accommodated at predetermined intervals in a vertical direction.

A heat insulator 11 is provided around the reaction chamber 2 so as to surround the reaction chamber 2. A temperature-increasing heater 12 formed of, for example, a resistive heating material, is provided on an inner wall surface of the heat insulator 11. The inside of the reaction chamber 2 is heated to a predetermined temperature by the temperature-increasing heater 12, and accordingly, a semiconductor wafer 10 is heated to a predetermined temperature.

A plurality of process gas introduction pipes 13 pass through (are connected to) a side surface of the manifold 5. In FIG. 1, only one process gas introduction pipe 13 is shown. The process gas introduction pipe 13 is provided to the inside of the inner chamber 3. For example, as shown in FIG. 1, the process gas introduction pipe 13 passes through the side surface of the manifold 5, which is lower than the support ring 6 (lower portion of the inner chamber 3).

The process gas introduction pipe 13 is connected to a process gas supply source (not shown) via a mass flow controller (not shown). Thus, a desired amount of process gas is supplied into the reaction chamber 2 from the process gas supply source via the process gas introduction pipe 13. An example of the process gas supplied through the process gas introduction pipe 13 may be a film forming gas for forming a polysilicon film (Si film) doped with boron (B) as impurities. As the film forming gas, for example, $SiH_4$ or the like, and a gas containing B ($BCl_3$ or $B_2H_6$) is used. Also, in a case where a polysilicon film (Si film) doped with B and carbon (C) as the impurities is formed, for example, $SiH_4$ or the like, a gas containing B ($BCl_3$ or $B_2H_6$), and a gas containing C ($C_2H_4$) can be used. Also, if the polysilicon film doped with the impurities is additionally doped with impurities, the above described $BCl_3$ or the like is used.

Also, according to the method of forming a silicon film of the present embodiment, as will be described below, a Si film is embedded on a groove provided on a semiconductor wafer 10 in a first film forming process, and after that, an opening of the embedded groove is enlarged in an etching process. Then, a Si film is embedded on the groove having the enlarged opening in a second film forming process. In the above processes, an etching gas is supplied as a process gas through the process gas introduction pipe 13. The etching gas may be, for example, a halogen gas, such as $Cl_2$, $F_2$, and $ClF_3$.

Also, according to the method of forming a silicon film of the present embodiment, if a seed layer is formed on the groove before the first film forming process as will be described below, a seed layer forming gas, for example, silane containing an amino group or higher silane, such as $Si_2H_6$ and $Si_4H_{10}$, is supplied into the reaction chamber 2 from the process gas introduction pipe 13. The silane containing the amino group may be, for example, bis(tertiarybutylamino) silane (BTBAS), tris(dimethylamino)silane (3DMAS), tetra (dimethylamino)silane (4DMAS), (diisopropylamino)silane (DIPAS), bis(diethylamino)silane (BDEAS), or bis(dimethylamino)silane (BDMAS).

An exhaust port 14 is provided in the side surface of the manifold 5 so as to exhaust gases inside the reaction chamber 2. The exhaust port 14 is provided above the support ring 6, and is communicated with a space provided between the inner chamber 3 and the outer chamber 4 in the reaction chamber 2. In addition, an exhaust gas or the like generated in the inner chamber 3 passes through the space provided between the inner chamber 3 and the outer chamber 4 to be exhausted through the exhaust port 14.

Below the exhaust port 14, a purge gas supply pipe 15 passes through the side surface of the manifold 5. A purge gas supply source (not shown) is connected to the purge gas supply pipe 15, and a desired amount of purge gas, for example, nitrogen gas, is supplied into the reaction chamber 2 from the purge gas supply source via the purge gas supply pipe 15.

An exhaust pipe 16 is hermetically connected to the exhaust port 14. A valve 17 and a vacuum pump 18 are provided at the exhaust pipe 16 in the stated order from an upstream side thereof. The valve 17 adjusts an opening degree of the exhaust pipe 16 to control a pressure inside the reaction chamber 2 to be at a predetermined pressure level. The vacuum pump 18 adjusts a pressure inside the reaction chamber 2 while exhausting the gases inside the reaction chamber 2 through the exhaust pipe 16.

Also, a trap, a scrubber, and the like (not shown) are provided at the exhaust pipe 16, and the exhaust gas exhausted from the reaction chamber 2 is purified and exhausted out of the thermal treatment apparatus 1.

Figure 2:
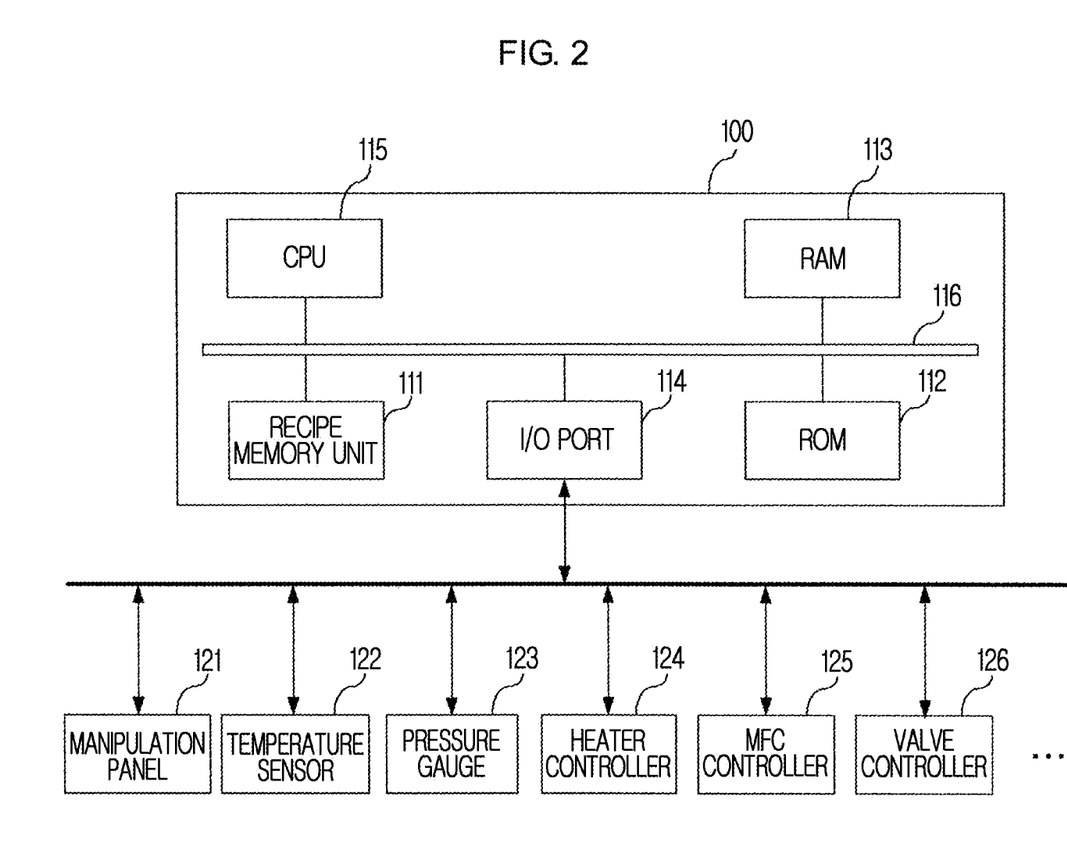
FIG. 2 is a view of a controller shown in FIG. 1.

Also, the thermal treatment apparatus 1 includes a controller 100 controlling each of components in the thermal treatment apparatus 1. FIG. 2 shows a configuration of the controller 100. As shown in FIG. 2, a manipulation panel 121, a temperature sensor (group) 122, a pressure gauge (group) 123, a heater controller 124, an MFC controller 125, a valve controller 126, and the like are connected to the controller 100.

The manipulation panel 121 includes a display screen and a manipulation button so as to transmit a manipulation direction of an operator to the controller 100 and to display various types of information transmitted from the controller 100 on the display screen.

The temperature sensor (group) 122 measures a temperature inside each of the components, such as the reaction chamber 2, the process gas introduction pipe 13, and the exhaust pipe 16, and notifies the measured values to the controller 100.

The pressure gauge (group) 123 measures a pressure inside each of the components, such as the reaction chamber 2, the process gas introduction pipe 13, and the exhaust pipe 16, and notifies the measured values to the controller 100.

The heater controller 124 is provided to separately control the temperature-increasing heaters 12. The heater controller 124 makes the temperature-increasing heaters 12 electrically conduct in response to a command from the controller 100, and separately measures a power consumption of the temperature-increasing heaters 12 to notify the measured values to the controller 100.

An MFC controller 125 controls the mass flow controller (MFC) (not shown) provided in the process gas introduction pipe 13 and the purge gas supply pipe 15 to adjust flow rates of the gas flowing in the process gas introduction pipe 13 and the purge gas supply pipe 15 to flow rates directed by the controller 100, and at the same time, measures actual flow rates of the gases to notify the measured values to the controller 100.

The valve controller 126 controls an opening degree of a valve at each of the pipes to be at an opening degree directed by the controller 100.

The controller 100 includes a recipe memory unit 111, ROM 112, RAM 113, an I/O port 114, a central processing unit (CPU) 115, and a bus 116 by which each of them is connected.

The recipe memory unit 111 stores a set-up recipe and a plurality of process recipes. At a stage of manufacturing the thermal treatment apparatus 1, only a set-up recipe is stored in the recipe memory unit 111. The set-up recipe is executed when a thermal model or the like according to each thermal treatment apparatus is generated. The process recipe is prepared per thermal treatment (process) actually executed by a user, and regulates, for example, a temperature variation of each component, a pressure variation inside the reaction chamber 2, timings of starting and stopping supply of the process gas, and a supply amount of the process gas, from a stage of loading the semiconductor wafers 10 to a stage of unloading the semiconductor wafers 10 after a process completion is finished.

The ROM 112 is a recording medium including an EEPROM, a flash memory, a hard disk, and the like, and stores an operating program or the like of the CPU 115.

The RAM 113 serves as a work area or the like of the CPU 115.

The I/O port 114 is connected to the manipulation panel 121, the temperature sensor (group) 122, the pressure gauge (group) 123, the heater controller 124, the MFC controller, the valve controller 126, and the like to control input/output of data or signals.

The CPU 115 is a pivotal element of the controller 100, and executes a control program stored in the ROM 112 to control operations of the thermal treatment apparatus 1 according to commands from the manipulation panel 121 and according to a recipe (process recipe) stored in the recipe memory unit 111. That is, the CPU 115 commands the temperature sensor (group) 122, the pressure gauge (group) 123, the MFC controller 125, and the like to measure the temperature, the pressure, the gas flow rate, and the like of each of the components inside the reaction chamber 2, the process gas introduction pipe 13, and the exhaust pipe 16. In addition, the CPU 115 outputs control signals to the heater controller 124, the MFC controller 125, the valve controller 126, and the like based on the measurement data to control each of the components to operate according to the process recipes.

The bus 116 transfers information between the components.

Next, a method of forming a silicon film by using the above described thermal treatment apparatus 1 will be described. Also, hereinafter, operations of the components configuring the thermal treatment apparatus 1 are controlled by the controller 100 (CPU 115). Also, in each of the processes, the temperature, the pressure, and the gas flow rate inside the reaction chamber 2 are set according to conditions of a recipe, for example, as shown in FIG. 3, when the controller 100 (CPU 115) controls the heater controller 124 (the temperature-increasing heater 12), the MFC controller 125, the valve controller 126, and the like.

Figure 4A:
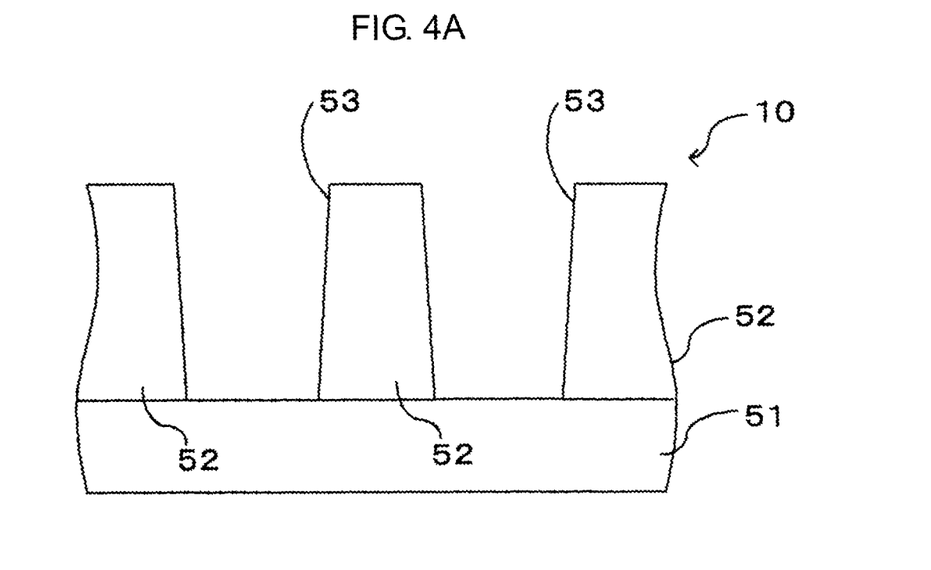
FIGS. 4A through 4D are views describing a method of forming a silicon film according to an embodiment of the present invention.

Also, according to the present embodiment, an insulating film 52 is formed on a substrate 51 as shown in FIG. 4A in a semiconductor wafer 10, that is, an object to be processed, and grooves 53 are provided on the surface of the semiconductor wafer 10.

The method of forming a silicon film, according to the present embodiment, includes a first film forming process in which a silicon film (Si film) 55 doped with impurities containing boron (B) and having openings 54 is provided to embed the grooves 53, an etching process in which the formed Si film 55 is etched to enlarge the openings 54 to have V-shapes, a doping process in which the Si film 55 having the enlarged openings 54 is doped with impurities containing B, and a second film forming process in which a Si film 56 doped with impurities containing B is formed so as to embed the Si film 55 (openings 54) doped with the impurities. Hereinafter, the method of forming a silicon film including the above described processes will be described below.

Figure 3:
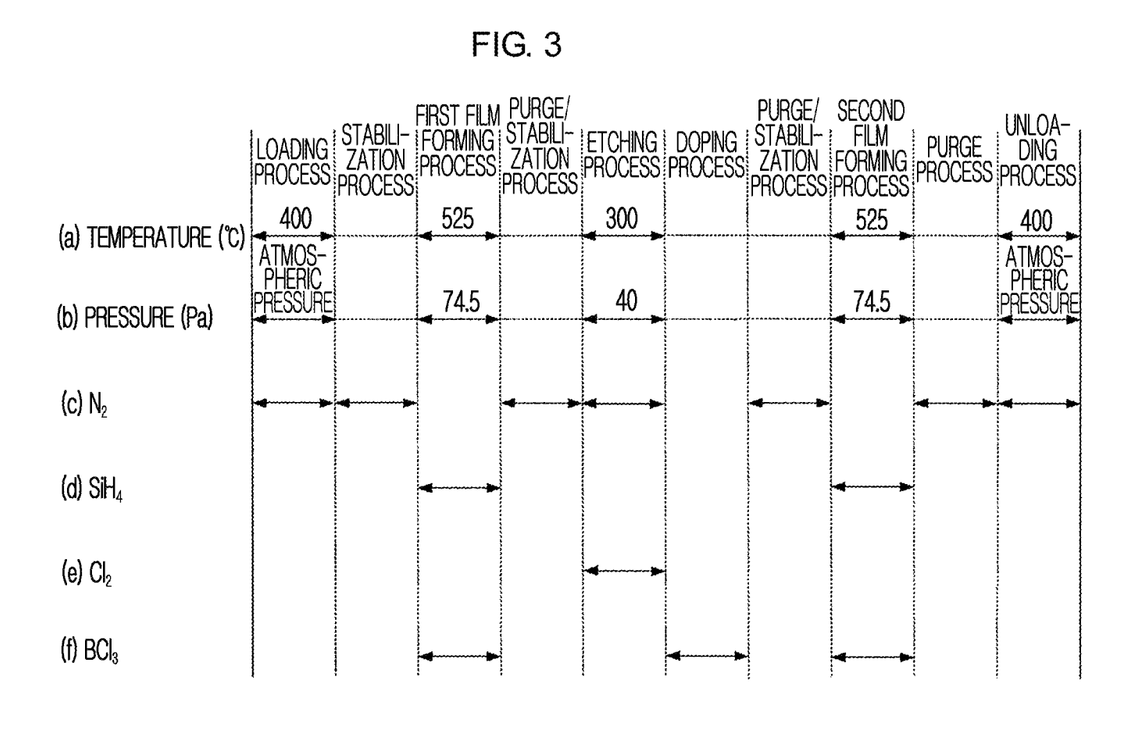
FIG. 3 shows a recipe for explaining a method of forming a silicon film according to an embodiment of the present invention.

First, a temperature inside the reaction chamber 2 (inner chamber 3) is set to a predetermined temperature, for example, 400° C., as shown in FIG. 3 (a). Also, as shown in FIG. 3 (c), a predetermined amount of nitrogen is supplied from the purge gas supply pipe 15 into the inner chamber 3 (reaction chamber 2). Next, the wafer boat 9 in which the semiconductor wafer 10 shown in FIG. 4A is accommodated is placed on the lid 7. In addition, the lid 7 is elevated by the boat elevator 8 so as to load the semiconductor wafer 10 (wafer boat 9) in the reaction chamber 2 (loading process).

In addition, a predetermined amount of nitrogen is supplied into the inner chamber 3 from the purge gas supply pipe 15, as shown in FIG. 3 (c), and at the same time, the temperature inside the reaction chamber 2 is set to a predetermined temperature, for example, 525° C., as shown in FIG. 3 (a). Also, a gas inside the reaction chamber 2 is exhausted, and the inside of the reaction chamber 2 is depressurized to a predetermined pressure, for example, 74.5 Pa (0.56 Torr), as shown in FIG. 3 (b). In addition, the inside of the reaction chamber 2 is stabilized at the above temperature and pressure (stabilization process).

Here, the temperature inside the reaction chamber 2 may range from 450° C. to 700° C., and more preferably, from 490° C. to 650° C. Also, the pressure inside the reaction chamber 2 may range from 1.33 Pa to 133 Pa (0.01 Torr to 1 Torr). By setting the temperature and the pressure inside the reaction chamber 2 within the above ranges, a Si film may be uniformly formed.

Figure 4B:
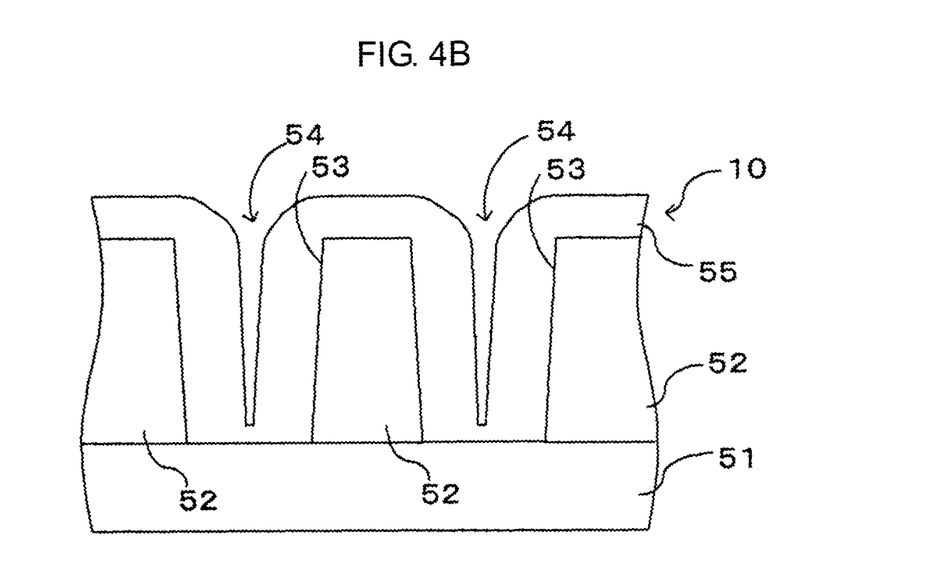

When the inside of the reaction chamber 2 is stabilized at the predetermined temperature and the predetermined pressure, the supply of nitrogen from the purge gas supply pipe 15 is stopped. In addition, as shown in FIG. 3 (d), a predetermined amount of film forming gas, for example, $SiH_4$, and as shown in FIG. 3 (f), a gas containing B, for example, $BCl_3$, are supplied from the process gas introduction pipe 13 into the reaction chamber 2 (first film forming process). According to the first film forming process, as shown in FIG. 4B, the Si film 55 having the openings 54 and doped with B (impurities) is formed on the insulating film 52 and on the grooves 53 of the semiconductor wafer 10.

Here, the Si film 55 doped with B may be formed on the insulating film 52 and on the grooves 53 of the semiconductor wafer 10 so as to have the openings 54 in the first film forming process. That is, in the first film forming process, the Si film 55 doped with B may be formed not to completely embed the grooves 53 but to have the openings 54 provided with respect to the grooves 53. Accordingly, generation of voids in the grooves 53 may be definitely prevented in the first film forming process.

When the Si film 55 doped with a predetermined amount of B is formed on the semiconductor wafer 10, the supply of the film forming gas from the process gas supply pipe 13 is stopped. Next, as shown in FIG. 3 (c), a predetermined amount of nitrogen is supplied from the purge gas supply pipe 15 into the inner chamber 3, and at the same time, the temperature inside the reaction chamber 2 is set to a predetermined temperature, for example, 300° C., as shown in FIG. 3 (a). Also, the gas inside the reaction chamber 2 is exhausted, and the reaction chamber 2 is depressurized to a predetermined pressure, for example, 40 Pa (0.3 Torr), as shown in FIG. 3 (b). Then, the inside of the reaction chamber 2 is stabilized at the above temperature and the pressure (purge/stabilization process). Also, in order to completely exhaust the gas inside the reaction chamber 2, the operations of exhausting the gas inside the reaction chamber 2 and supplying the nitrogen gas may be repeatedly performed a plurality of times.

Here, the temperature inside the reaction chamber 2 may preferably range from 100° C. to 550° C. If the temperature is lower than 100° C., the Si film 55 doped with B may not be etched in the etching process that will be described below. If the temperature is higher than 550° C., it may be difficult to control the etching state of the Si film 55 doped with B. The pressure inside the reaction chamber 2 may preferably range from 1.33 Pa to 666.7 Pa (0.01 Torr to 5 Torr).

Figure 4C:
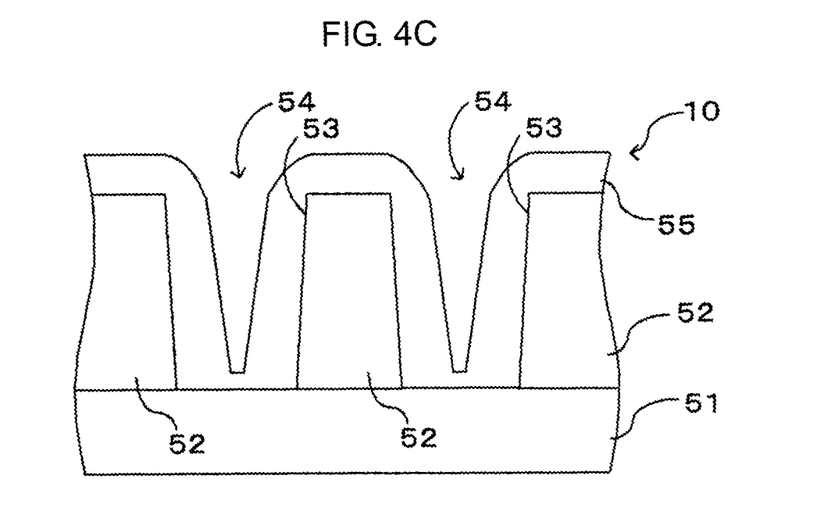

When the inside of the reaction chamber 2 is stabilized at the predetermined pressure and the predetermined temperature, as shown in FIG. 3 (c), a predetermined amount of nitrogen is supplied from the purge gas supply pipe 15 into the inner chamber 3, and at the same time, as shown in FIG. 3 (e), a predetermined amount of etching gas, for example, $Cl_2$, is supplied from the process gas introduction pipe 13 into the reaction chamber 2 (etching process). According to the etching process, as shown in FIG. 4C, the Si film 55 having the openings 54 provided with respect to the grooves 53 of the semiconductor wafer 10 is etched.

Here, in the etching process, the openings 54 of the Si film 55 formed in the first film forming process are enlarged due to the etching process. That is, as shown in FIG. 4C, the Si film 55 around the openings 54 is largely etched, and at the same time, the Si film 55 near the bottom portions of the grooves 53 is less etched so that the openings 54 are provided to be V-shaped. Accordingly, it is easy to form the Si film near the bottom portions of the grooves 53 in the second film forming process that will be described below. Also, it is easy to dope the Si film 55 near the bottom portions of the grooves 53 with the impurities in the doping process that will be described below.

Also, the etching gas may use a $Cl_2$ gas that easily controls an etching state of the Si film 55. If the $Cl_2$ is used as the etching gas, the temperature inside the reaction chamber 2 may be set within a range from 250° C. to 300° C. Also, the pressure inside the reaction chamber 2 may be set within a range from 1.33 Pa to 666.7 Pa (0.01 Torr to 5 Torr). By setting the temperature and the pressure inside the reaction chamber 2 in the above ranges, an excellent etching uniformity can be obtained.

When a desired etching process of the Si film 55 doped with B is finished, the supply of the etching gas from the process gas introduction pipe 13 is stopped. Next, inside of the reaction chamber 2 is heated to a predetermined temperature, for example, 525° C., as shown in FIG. 3 (a). At the same time, the gas inside the reaction chamber 2 is exhausted and the inside of the reaction chamber 2 is depressurized to a predetermined pressure, for example, 74.5 Pa (0.56 Torr), as shown in FIG. 3 (b). In addition, as shown in FIG. 3 (f), a predetermined amount of impurity, for example, boron ($BCl_3$), is supplied from the process gas introduction pipe 13 into the reaction chamber 2 (doping process). The amount of the impurity (B) included in the Si film 55 may be adjusted to a predetermined amount through the doping process.

Here, since the Si film 55 formed in the first film forming process is etched so that the openings 54 are enlarged in the etching process, it is easy to dope the Si film 55 near the bottom portions of the grooves 53 with the impurity.

Next, as shown in FIG. 3 (c), a predetermined amount of nitrogen is supplied from the purge gas supply pipe 15 into the inner chamber 3, and at the same time, the inside of the reaction chamber 2 is stabilized at the temperature of 525° C. and the pressure of 74.5 Pa (0.56 Torr) (purge/stabilization process). Also, in order to completely exhaust the gas inside the reaction chamber 2, the operations of exhausting the gas inside the reaction chamber 2 and supplying the nitrogen gas may be repeatedly performed a plurality of times.

When the inside of the reaction chamber 2 is stabilized at the predetermined pressure and the predetermined temperature, the supply of nitrogen from the purge gas supply pipe 15 is stopped. In addition, as shown in FIG. 3 (d) and FIG. 3 (f), a predetermined amount of film forming gas, for example, $SiH_4$ and $BCl_3$, is supplied from the process gas introduction pipe 13 into the reaction chamber 2 (second film forming process). Due to the second film forming process, the Si film 56 doped with B is formed on the Si film 55 doped with B, as shown in FIG. 4D.

Here, since the openings 54 of the Si film 55 formed in the first film forming process are enlarged due to the etching process, it is easy to form the Si film 56 near the bottom portions of the grooves 53. Thus, when the Si film 56 is embedded on the grooves 53, generation of voids or seams in the grooves 53 may be prevented.

When the desired Si film 56 is formed, the supply of film forming gas from the process gas introduction pipe 13 is stopped. Next, as shown in FIG. 3 (c), a predetermined amount of nitrogen is supplied from the purge gas supply pipe 15 into the inner chamber 3, and at the same time, the temperature inside the reaction chamber 2 is set to a predetermined temperature, for example, 400° C., as shown in FIG. 3 (a). Also, the gas inside the reaction chamber 2 is exhausted, and the pressure inside the reaction chamber 2 is returned to an atmospheric pressure (purging process). Also, in order to completely exhaust the gas inside the reaction chamber 2, the operations of exhausting the gas inside the reaction chamber 2 and supplying the nitrogen gas may be repeatedly performed a plurality of times. In addition, the lid 7 is descended by the boat elevator 8 so as to unload the semiconductor wafer 10 (wafer boat 9) from the reaction chamber 2 (unloading process). Then, forming of a Si film is finished.

Figure 4D:
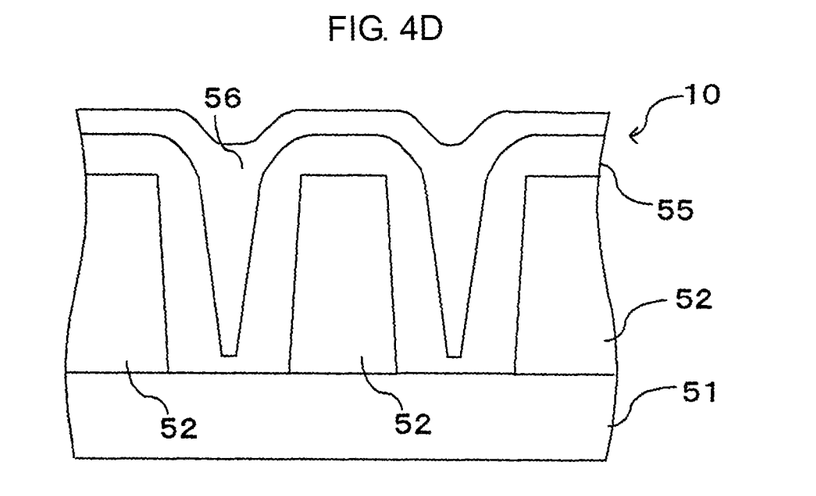

Next, in order to check the effects of the method of forming a silicon film according to the present embodiment, a Si film was formed on the semiconductor wafer 10 shown in FIG. 4A according to the recipe illustrated in FIG. 3, as shown in FIG. 4D. When the formed Si film was observed by using a scanning electron microscope (SEM), there was no void or seam in the Si film.

As described above, according to the embodiment of the present invention, after the first film forming process for forming the Si film 55 having the openings 54, the etching process for enlarging the openings 54 by etching the Si film 55, the doping process for doping the Si film 55 having the enlarged openings 54 with an impurity, and the second film forming process for forming the Si film 56 doped with the impurity are performed, and accordingly, the generation of voids or seams in the formed Si film may be prevented.

Also, the present invention is not limited to the above embodiments, and may be variously modified and applied. Hereinafter, other embodiments that can be applied to the present invention will be described.

In the above embodiments, an example of forming the Si film 55 doped with boron to have the openings 54 is described; however, the Si film 55 doped with boron may be formed to embed the grooves 53. In this case, generation of voids or seams in the formed Si film may be prevented by etching the Si film 55 in the etching process and forming the Si film 56 doped with an impurity in the second film forming process.

In the above embodiments, the openings 54 are etched to be V-shaped in the etching process; however, the openings 54 may be etched to be, for example, U-shaped. In this case, the generation of voids or seams in the formed Si film can be also prevented.

In the above embodiments, the first film forming process, the etching process, the doping process, and the second film forming process are performed; however, the second film forming process may be performed after performing the etching process without performing the doping process. In this case, the generation of voids or seams in the formed Si film can be also prevented.

Also, the second film forming process may be performed after repeatedly performing the first film forming process, the etching process, and the doping process a plurality of times. Also, a seed layer forming process for forming a seed layer on the insulating film 52 and the grooves 53 may be performed before the first film forming process. Also, a native oxide film removal process for removing a native oxide film formed on the bottom portions of the grooves 53 may be performed before the first film forming process.

In the above embodiments, the impurity is boron; however, the impurity may be any kind of impurity containing boron, for example, an impurity containing boron and carbon.

In the above embodiments, $SiH_4$ gas is used as an example of the film forming gas; however, another gas may be a gas capable of forming a Si film.

In the above embodiments, $Cl_2$ gas is used as an example of the etching gas; however, the etching gas may be a gas capable of etching a Si film doped with impurities containing boron in the first film forming process, and may be another halogen gas, such as $F_2$ or $ClF_3$.

In the above embodiments, a batch-type vertical thermal treatment apparatus of a double chamber structure is used as the thermal treatment apparatus; however, the present invention may be applied to a batch-type thermal treatment apparatus of a single chamber structure.

The controller 100 according to the embodiment of the present invention is not limited to an exclusive system, and may be realized by using a general computer system. For example, the controller 100 performing the aforesaid processes may be configured by installing a program in a general-purpose computer from a recording medium (e.g., a flexible disc or a CD-ROM) in which the program for executing the aforesaid processes is stored.

A unit for supplying the program is arbitrarily selected. In addition to the predetermined recording medium described above, for example, the program can be supplied via a communication line, a communication network, a communication system, and the like. In this case, the program may be posted on, for example, a bulletin board system (BBS) of a communication network, and may be provided by a carrier wave through the communication network. The aforesaid processes may be performed by starting the provided program under the control of an operating system (OS), like other application programs.

According to the present invention, the generation of voids or seams can be prevented.

What is claimed is:

1. A method of forming a silicon film on a groove provided on a surface of an object to be processed, the groove being formed of a bottom surface, a sidewall surface and an opening, the method comprising:

forming a first silicon film doped with impurities including boron on a first bottom surface and a first sidewall surface of a first groove to form a second groove inside the first groove, the second groove being formed of a second bottom surface, a second sidewall surface and a second opening, wherein the first silicon film is formed by supplying a silicon-containing gas and a boron-containing gas simultaneously and the second groove has a transversal cross section continuously becoming wider from the second bottom surface of the second groove to the second opening of the second groove;

immediately after forming the first silicon film, etching the second bottom surface and the second sidewall surface to form a third groove inside the first groove, the third groove being formed of a third bottom surface, a third sidewall surface and a third opening, wherein the third groove has a transversal cross section continuously becoming wider from the third bottom surface of the third groove to the third opening of the third groove; and forming a second silicon film doped with impurities including boron on the third bottom surface and the third sidewall surface of the third groove to fill the third groove, wherein the second silicon film is formed by supplying the silicon-containing gas and the boron-containing gas simultaneously, thereby preventing void or seams from generating in the first and second silicon films.

2. The method of claim 1, wherein the third opening is provided in a V-shape.

3. The method of claim 1, after the etching, further comprising a doping process for doping the etched second bottom surface and the etched second sidewall surface with the impurities including boron.

4. The method of claim 1, wherein the impurities further include carbon.

5. The method of claim 1, wherein the forming of the first silicon film and the etching are repeatedly performed a plurality of times, and after that, the forming of the second silicon film is performed.

6. The method of claim 1, wherein the forming of the first silicon film, the etching, and the forming of the second silicon film are performed in a state where the object is accommodated in a reaction chamber.

* * * * *